United States Patent [19]

Dumas

[11] 3,895,976

[45] July 22, 1975

[54] PROCESSES FOR THE LOCALIZED AND DEEP DIFFUSION OF GALLIUM INTO SILICON

[75] Inventor: Guy H. Dumas, Paris, France

[73] Assignee: Silec-Semi-Conducteurs, Paris, France

[22] Filed: Sept. 22, 1972

[21] Appl. No.: 291,479

[30] Foreign Application Priority Data

Sept. 27, 1971 France ............................ 71.34698

[52] U.S. Cl. .................................. 148/187; 148/189

[51] Int. Cl. .............................................. H01l 7/44

[58] Field of Search ..................................... 148/187

[56] References Cited

UNITED STATES PATENTS

| | | | |
|---|---|---|---|
| 3,255,056 | 6/1966 | Flatley et al. | 148/187 |
| 3,477,886 | 11/1969 | Ehlenberger | 148/187 |
| 3,484,309 | 12/1969 | Gilbert | 148/33.5 |
| 3,484,313 | 12/1969 | Tauchi et al. | 148/187 |
| 3,490,964 | 1/1970 | Wheeler | 148/187 |
| 3,646,665 | 3/1972 | Kim | 148/187 X |

OTHER PUBLICATIONS

Agusta et al., "Eliminating Thick Oxide in N-Channel FET Chips," IBM Tech. Discl. Bull., Vol. 13, No. 8, Jan. 1971, p. 2416.

*Primary Examiner*—L. Dewayne Rutledge
*Assistant Examiner*—J. M. Davis
*Attorney, Agent, or Firm*—Sughrue, Rothwell, Mion, Zinn & Macpeak

[57] ABSTRACT

Process for the localized and deep diffusion of gallium into silicon, and silicon nitride mask utilization; and semi-conductor devices obtained thereby.

A process of this type comprises the following operations: a) preparation of the surface of a specimen of N-type silicon intended to receive the diffusion localization mask; b) deposition of a first oxide layer on this surface; c) deposition of a silicon nitride layer forming a mask on the first oxide layer; d) photoengraving of the mask by means of a photosensitive product and a transfer layer formed by a second oxide layer; and opening of windows of localized diffusion in the mask; e) pre-diffusion of gallium into the silicon by means of the windows, and through the first oxide layer; f) removal of the silicon nitride mask and of the first oxide layer; g) deposition of a new first oxide layer on the whole silicon surface, followed by a new silicon nitride layer on this oxide layer; h) thermal treatment for penetration diffusion of the gallium into the silicon; i) removal of the layer of oxide and silicon nitride deposited during operation g), in order to obtain a structure with a localized and deep P-N junction.

The invention makes it possible, in particular, to obtain new combinations of structures having localized zones of diffused gallium, diodes or thyratrons having localized P-N junctions, with a silicon nitride mask whose use can reduce the contamination of the semi-conductor material by oxygen.

17 Claims, 5 Drawing Figures

PROCESSES FOR THE LOCALIZED AND DEEP DIFFUSION OF GALLIUM INTO SILICON

The present invention relates to processes for the localized diffusion of an impurity with a given type of conductivity into a substrate of the opposite type, to masks which can be used for conducting such diffusion operations, and to structures comprising localized P-N junctions which are obtained by the use of such masks and processes.

More particularly, the present invention relates to a process for the localized deep diffusion of gallium into silicon, to the silicon nitride mask used to carry out this diffusion, and to a process developed for the deposition of said nitride mask on silicon and the opening of its diffusion localization windows, and, furthermore, to silicon semi-conductor devices comprising localized P-N junctions, such as, for example, diodes and thyratrons thus obtained.

The production of a structure comprising localized P-N junctions may be considered as one of the most important technological processes in the manufacture of semi-conductor devices. At the present state of the art, it is known that, in order to produce a localized diffusion of an impurity with a given type of conductivity into a substrate of the opposite type, it is important to have available a material with masking properties, with respect to the diffusion impurity under consideration, which is easy to photoengrave with well-defined configurations by classical techniques. First, amorphous silica (chemical formula $SiO_2$) has for a long time constituted the most widely used diffusion mask for the manufacture of semi-conductor devices.

In fact, taking into account, the diffusion constants of the different dopants and the maximum thicknesses that are technically possible (about 1 micron) the masking of the oxide with respect to the dopants generally used (boron, phosphorous, arsenic), is efficient, but, on the other hand, silica acts as an insufficient, or even a zero, barrier, with respect to the diffusion of impurities such as gallium and oxygen.

Consequently, in the last few years, with a view to replacing silica in planar technology (signal devices and integrated circuits), the study of masks of silicon nitride with the formula $Si_3N_4$, has been the subject of numerous investigations. In fact, the physicochemical properties of this compound (high stability and great chemical inertness, effective barring of the diffusion of a large number of impurities, including those restrained by silica) make it attractive for the production of structures in the industrial field, such as, for example, diodes and thyratrons.

Furthermore, it should be remembered that gallium has numerous advantages over boron, including, among others:

1. The diffusion rate of this impurity at a given temperature is higher than that of boron. This results in shorter thermal treatments, and consequently, in a conservation of the operating life of the base material, such as silicon;

2. Since this element introduces fewer local defects than boron (diffusion heterogeneities and disturbance of the crystal lattice of the semi-conductor) this leads, with a conservation of the operating life of the devices, to an improved voltage characteristic of the devices.

For this reason, it is one of the main objects of the present invention to provide a process for the localized diffusion of an impurity, particularly gallium, into a silicon substrate by the use of a silicon nitride mask, making it possible to obtain new combinations of structures with localized zones of diffused gallium, which it has not been possible to obtain up till now by using a classical silica mask, since this did not provide an effective barrier to the diffusion of gallium.

Another object of the present invention is to provide such a process for localized and deep diffusion of gallium into silicon which leads to the production of diode or thyratron structures with localized P-N junctions, and which permits both an increase in control of the form of the diffusion front and higher voltage characteristics and, therefore, a breakdown occurring within the bulk instead of at the surface (which also causes a suppression of beveling).

Still another object of the present invention is to provide a silicon nitride mask which, in its use combined with non-oxidizing diffusion techniques (for example, diffusion in a sealed tube from metallic diffusion sources) may make it possible, to a certain extent, to reduce the contamination of the semi-conductor material by oxygen. (On this subject, it should be noted that oxygen combined with metallic impurities or impurities in the silicon is the source of defects prejudicial to the minority carrier lifetime, and to the voltage behavior of the devices.)

According to the invention, such a process of localized and deep diffusion of gallium into silicon comprises the following operations:

a. Chemical polishing of the surface of the specimen of N-type silicon intended to receive the diffusion localization mask;

b. Deposition of a first oxide layer on the surface;

c. Deposition of a silicon nitride layer forming a mask on the first oxide layer;

d. Photoengraving of the mask by means of a photosensitive product and a transfer layer formed by a second layer of pyrolytic oxide or polycrystalline silicon and opening of localized diffusion windows in the mask;

e. Pre-diffusion of gallium into the silicon, by means of these windows, through the first oxide layer;

f. Removal of the silicon nitride mask and of the first oxide layer;

g. Deposition of a new first oxide layer on the whole of the silicon surface, followed by deposition of a new silicon nitride layer on the oxide layer;

h. Thermal treatment for penetration diffusion of the gallium into the silicon; and i. Removal of the oxide and silicon nitride layers deposited during operation g) in order to obtain a structure with localized and deep P-N junctions.

It should, however, be specified that, according to the invention, certain of these operations should be carried out in a quite specific manner, and their details will be given below:

1. The deposition of the first oxide layer can be carried out in two ways:

a. pyrolytically, for example, by using $SiH_4 + CO_2$ ($SiH_4/CO_2$ mixtures contain 1% silane) at 775° C. and a flow rate of 8 liters per minute of $H_2$ in a reactor with resistance heating until a thickness of deposition of the oxide of about 2,500 A is obtained, with the duration of the operation being about 15 minutes.

b. thermally, for example, using moist $O_2$ for two and a half hours, then dry $O_2$ for two hours, at a temperature of about 1120°C. in a diffusion furnace, with the thickness of oxide obtained then, being about 1 micron.

2. Deposition of the silicon nitride mask to a thickness of between 3,000 and 5,000 A can be achieved by a chemical decomposition reaction of silane and ammonia in the vapor phase:

$3SiH_4 + 4NH_3 + H_2 \rightarrow Si_3N_4 + 12H_2 + H_2$ and, to do this, the following deposition cycle is applied:

a. The substrates to be treated are introduced into a reactor under continuous sweeping with nitrogen or hydrogenated nitrogen;

b. After closure of the reactor and heating of the reactor under the sweeping atmosphere, the controlled mixture of reagents is admitted into the laboratory tube, with these reagents used being of very high purity and comprising anhydrous ammonia, hydrogen used as a carrier gas, pure silane or silane diluted with nitrogen, hydrogenated nitrogen used as a sweeping gas and argon used as a purge gas for the silane circuit;

c. The deposition of the nitride proper is then carried out, and, at the end of this deposition;

d. The reactor is separated from the source of gaseous reagent, and the temperature is reduced while sweeping with nitrogen or hydrogenated nitrogen;

e. Finally, the substrate coated with the nitride deposit, is removed from the reactor.

It should be noted that, during tests carried out by the applicant, in the chemical decomposition reaction of silane and ammonia in the vapor phase, it has been found that an increase in temperature during annealing or thermal treatments, causes cracking of the nitride layers along with an increase in density of the compound. This phenomenon may appear, starting at the deposition temperature (generally in the neighborhood of 800°C.) with curvature of the substrates for films with a thickness greater than 2,500 A.

A study of the conditions of deposition of the nitride by pyrolysis of silane in the presence of ammonia has, however, made it possible to determine the conditions for the formation of thin layers (3 to 5,000 A), which are homogeneous, uniform and uncracked (several square centimeters of useful surface). It should be noted that the potential of crack formation decreases strongly and becomes zero when the silane/ammonia mixture tends to 10% silane.

For example, for the preparation of nitride masks, for the configuration of reactor used (resistance heating), the following experimental deposition conditions are suitable:

Deposition temperature ($T_d$): $800° < T_d < 850°C$

Hydrogen carrier gas: flow rate: 8 lit./min.

Silane/ammonia ratio: $10\% \leq SiH_4/NH_3 \leq 20\%$ At 850°C., the rate of nitride formation for a $SiH_4/NH_3$ ratio of 2/10 is 1,300 A/min., its rate of attack in orthophosphoric acid at 180°C. is 100 to 120 A/min. and, in 49% HF at 25°C., it is 100 to 150 A/min. The nitride film is also characterized by an infrared absorption spectrum, which contains only the absorption band due to the Si — N group at 870 $cm.^{-1}$.

3. The operation of photoengraving and window opening in the nitride film obtained consists in depositing on this film an adhesive compound which is easy to photoengrave by classical methods and is selected to resist the action of acids capable of dissolving the nitride, so that it will constitute a mask for the opening of the nitride per se. On this subject, it should be noted that the chemically inert nitride resists the majority of acid reagents used for the opening of silica layers: only concentrated (49%) HF at 25°C. and $H_3PO_4$ at 180°C. attach the nitride to an appreciable extent. The photoengraving of the nitride therefore requires:

a. On the one hand, the use of transfer layers, with a thickness close to one micron, such as a layer of pyrolitic silica or a layer of polycrystalline silicon, formed in situ in the reactor, and, on the other hand, b. The use of a photosensitive product, such as the product known under the name KPR or another product known under the name of KMER.

It should be noted, that the transfer layers can be obtained (particularly in the case of an apparatus using resistance heating):

as far as the pyrolytic silica is concerned: by the action of carbon dioxide on silane in the presence of hydrogen as carrier gas (deposition temperature 775° to 800°C.), hydrogen rate: 8 lit./min., silane/carbon dioxide ratio: 1 to 2%, deposition rate: 180 A/min., rate of dissolution in a mixture of 6 parts $NH_4F$ and 1 part HF at 25°C.: 0.1.3 $\mu$/min.;

as for the polycrystalline silicon: by cracking of silane in the presence of hydrogen (deposition temperature 775°C.), hydrogen rate: 8 lit./min., silane/hydrogen ratio: 0.2 to 0.5%, deposition rate: 1 $\mu$/min., rate of solution in a mixture of 10 parts $HNO_3$, 3 parts HF, 6 parts $CH_3COOH$, at 25°C.: 2 $\mu$/min.

Furthermore, it should be noted that, during the opening of the windows in the nitride mask, the underlying layer of oxide remains unattacked.

Before undertaking the description of the various operations perliminary to the deep diffusion of gallium into the silicon with localization by the nitride, one should take into account certain observations that have been made in the course of tests by the applicant. An examination of the masking properties of silicon nitride with respect to the diffusion of gallium has shown:

on the one hand, that films with a thickness below 1,500 A are generally porous and do not significantly restrain this impurity.

on the other hand, in view of the fact that the value of the diffusion coefficient of gallium into the nitride is close to $6 \times 10^{-16}$ $cm^2$ $sec^{-1}$ at 1,225°C., that a deep diffusion of this impurity (depths of diffusion $x_j = 70$ $\mu$) can be restrained only by a nitride layer with a thickness approaching 7,000 A. Such a thickness of nitride would efficiently mask a diffusion of gallium of this extent if it were not, as was stated above, for the phenomenon of cracking of the layers from 2,500 A on.

However, the nitride made according to the conditions described constitutes, at thicknesses of 1,500 A or above, an effective barrier to the diffusion of gallium to a depth 10 microns. The nitride remains adhesive and does not crack. However, it should be noted that, after an annealing or diffusion treatment at high temperature, the chemical inertness of this compound is greatly increased. In 49% HF and $H_3PO_4$ at 180°C., the nitride remains practically unattackable.

Thus, as has been stated above, the deep diffusion of gallium is preceded by:

4. The pre-diffusion of gallium through the underlying oxide into the windows of the nitride mask carried out, for example, in the following manner: the slices are placed vertically in a quartz tube with a source of 10 milligrams of gallium alloyed with silicon. The tube is sealed under an argon pressure of 200 grams/cm$^2$ after a high vacuum. It is placed for 40 minutes at 1,225°C, into a regulated furnace. The temperature drop at the end of the diffusion cycle is 150°C./hour. The surface concentration of gallium found on a N-type substrate ($C_D = 10^{14}$ at/cm$^3$) is $10^{19}$ at/cm$^3$, with the penetration of the impurity reaching 6 to 7 microns under the conditions cited.

5. The removal of the silicon nitride mask charged with gallium and of the underlying oxide or first layer is carried out by acid attack with 49% concentrated HF at 25°C. for a period of about 24 hours. It is to be noted that the presence of this underlying oxide permits the removal of the nitride mask which, after the prediffusion treatment, has become practically insoluble. It is also possible to effect the removal of the nitride and oxide layers by lapping. However, this process has a disadvantage in that it is difficult to control, since the lapping can reach the first microns of the diffused layer and cause a decrease in the surface concentration of the gallium.

6. The deposition of a new oxide layer or second layer carried out according to one of the methods described in 1), followed by a new layer of silicon nitride produced as in 2), with these layers having the same characteristics as the first two initial layers (a thermal oxidation at high temperature would cause an exodiffusion of the gallium).

At this stage, there is carried out:

7. The thermal penetration diffusion treatment of gallium into the silicon. This operation can take place either in a sealed tube under argon, like the prediffusion described in 4), or in an open tube under an argon sweep (1 lit./min). At 1,200°C., for example, and after a period of 65 hours, the depths of diffusion of the gallium reaches 50 microns, and the surface concentration of the impurity decreases by a factor 10, as compared with the concentration found after the prediffusion treatment. It should be noted that the presence of the silicon nitride during this thermal treatment of deep diffusion of gallium has the object of preventing the exodiffusion of the impurity, that is, the decrease in the surface concentration.

8. Finally, the layers of silicon nitride and underlying oxides are removed in the manner previously described in 5).

It should, however, be noted, that, at the end of this eighth operation, if one does not wish to remove the nitride layer, the underlying oxide layer is not necessary.

The present invention will be understood even better by means of the following description, presented in relation with the attached drawing, in which.

As has been stated above, the preparation of the silicon nitride is carried out by the chemical decomposition process in the silane-ammonia vapor phase, that is, by the following reaction:

$$3\ SiH_4 + 4\ NH_3 + H_2 \rightarrow Si_3N_4 + 12\ H_2 + H_2$$

The reagents used for this chemical decomposition have the following minimum purities (%):

| | |
|---|---|
| Anhydrous ammonia | (99.999) |
| Hydrogen | (99.995) (carrier gas) |
| Silane, pure or diluted in nitrogen | (5% in $N_2$) |
| Hydrogenated nitrogen | (5 and 10% $H_2$ in $N_2$ (sweeping gas) |
| Argon | (99.995) (purge gas of the silane circuit) |

Figure 1:
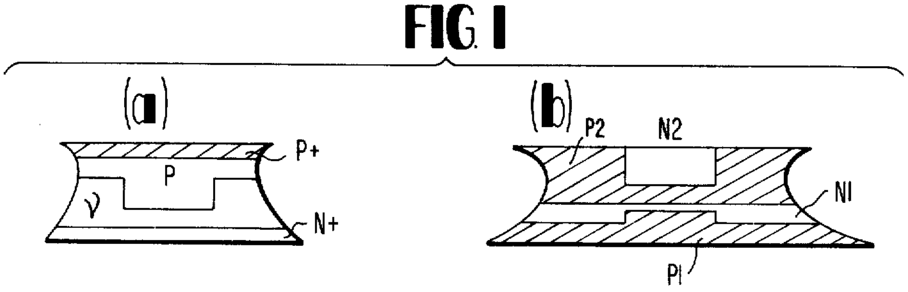
FIG. 1 is a schematic representation of two semiconductor structures with localized P-N junctions, given as nonlimiting examples, and which can be obtained, among others, by carrying out the process of deep diffusion of gallium into silicon which constitutes one of the principal objects of the invention. In (a), the structure obtained is a diode, while in (b), it is in the form of a thyratron.
Figures 2, 5:
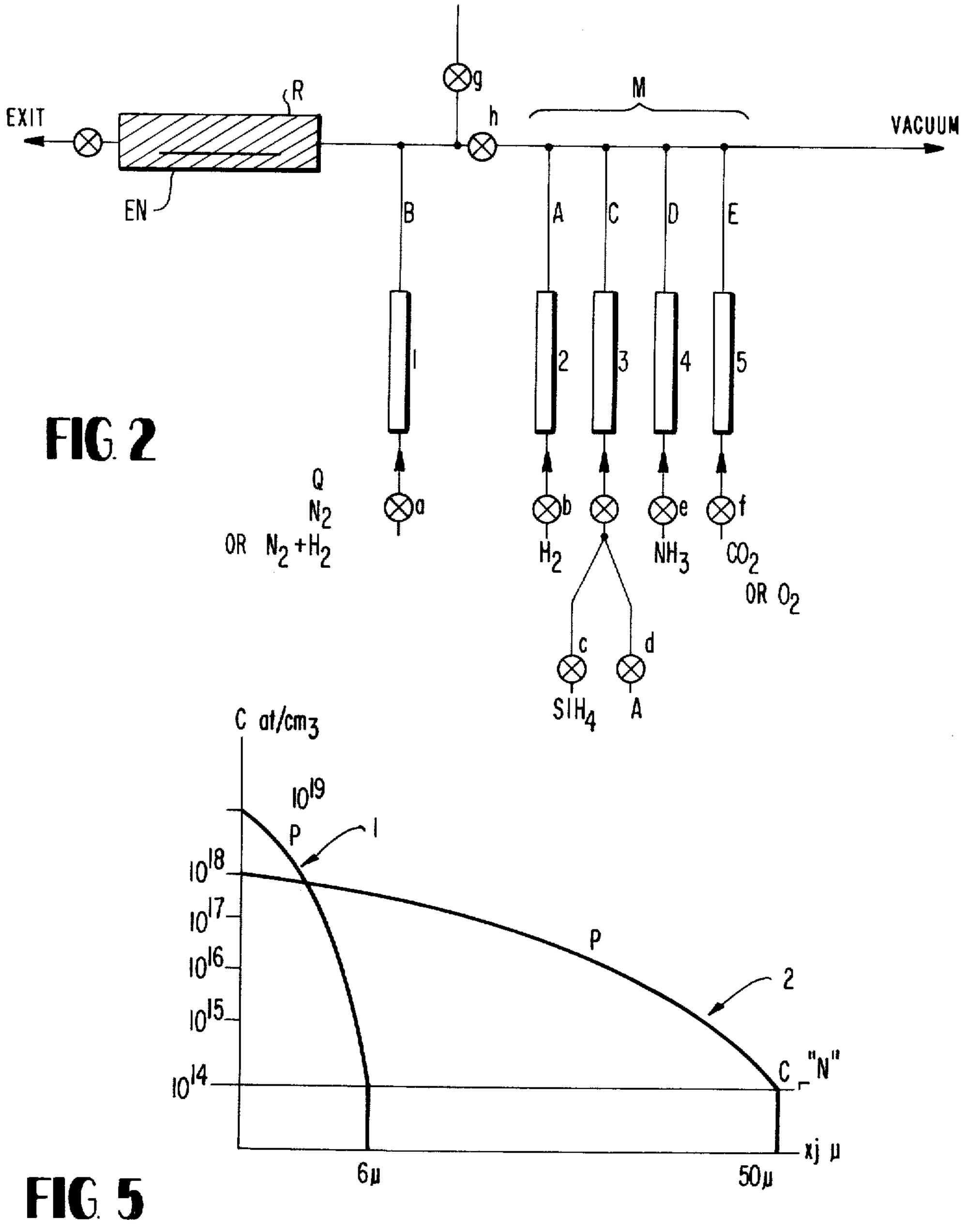
FIG. 2 is a schematic representation of the system used for the preparation of the silicon nitride which will mask for the localized and deep diffusion of gallium into the silicon.
FIG. 5 is a diagram of the diffusion profile which can be obtained by carrying out the process according to the invention.

The separate use for a process of this type is shown schematically in FIG. 2 and includes: a horizontal quartz reactor R enclosing a quartz laboratory tube EN (generally with a diameter of 60 mm), a stand M for mixing and metering of the gaseous reagents, a purge circuit P and a vacuum group, and an external gas supply (these last two devices are not shown).

The stand for mixing and metering of the gaseous reagents includes the following circuits: a circuit A for pure hydrogen, a circuit B for hydrogenated nitrogen, a circuit C for pure or diluted silane and the argon purge, a circuit D for ammonia. An additional circuit E for carbon dioxide or pure oxygen can be used for the preparation of the pyrolitic silica by vapor-phase chemical decomposition of the silane. It should be noted that the references *a* to *h* indicate microvalves, while the references 1 to 5 indicate calibrated flow meters.

The substrates are placed on a quartz support if the set-up uses a resistance furnace (quartz laboratory tube) or on a graphite susceptor covered with silicon carbide, in the case of a heating by high-frequency induction (cell of the "epitaxial" type cooled by flowing water).

The introduction of the suitably prepared substrates into the enclosure (EN) of the reactor takes place under a continuous sweep of nitrogen or hydrogenated nitrogen.

After closure of the laboratory tube and heating of the reactor under the sweep atmosphere, the following operations are carried out:

Admission of the suitably metered mixture of reagents into the laboratory tube

Deposition of the nitride per se

At the end of this, isolation of the laboratory tube (EN) from the stand (M) and decrease in temperature under a sweep of hydrogen followed by nitrogen or hydrogenated nitrogen Removal of the substrates coated with a deposit of nitride.

Figure 4:
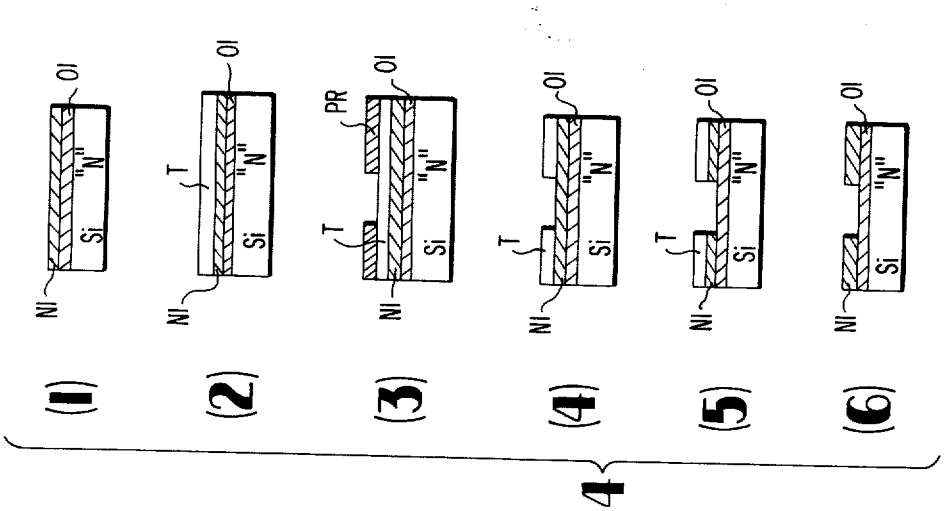
FIG. 4 is a more detailed schematic representation of the stage of photoengraving of the silicon nitride mask for the purpose of pre-diffusion of the gallium, and then of the deep diffusion proper of the gallium into a silicon substrate.
Figure 3:
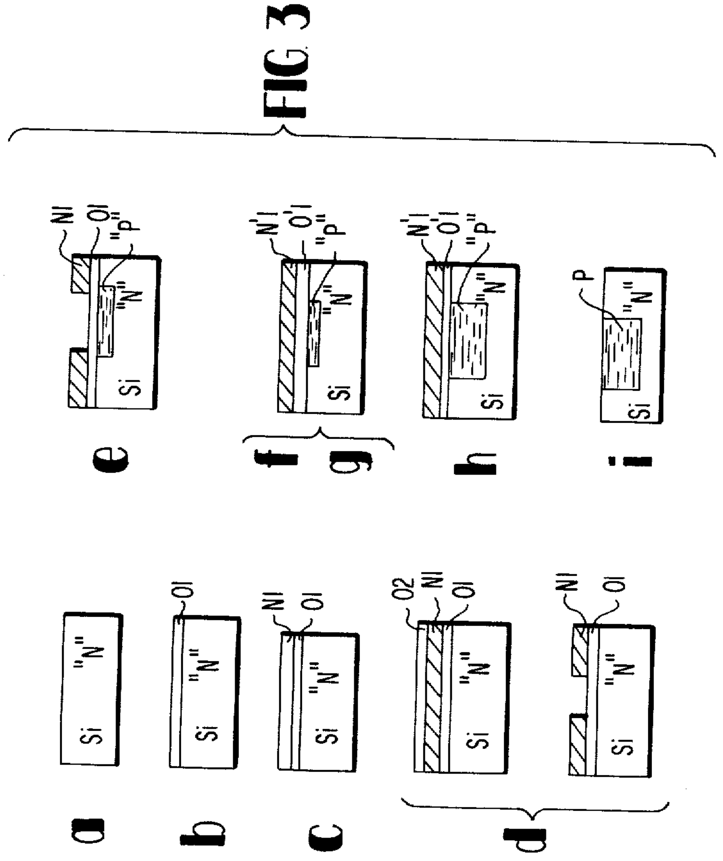
FIG. 3 is a schematic representation of the various stages of execution of the process according to the invention.

With respect to FIGS. 3 and 4, the complete stages of the process according to the invention will be described in detail, including the process of deposition of the silicon nitride mask that we have just described in relation to FIG. 2. These stages include:

a. Preparation of the sample; this is carried out by chemical polishing on the surface receiving the deposit.

b. A first deposit 01 of underlying oxide can be produced thermally or pyrolytically.

c. Deposition of the nitride mask N1 by chemical decomposition in the silane-ammonia vapor phase. This deposit is produced, for example, at a temperature $T_d$ corresponding to $800° < T_d < 850°C.$, with hydrogen as a carrier gas at a rate of 8 lit./min., and with the ratio silane:ammonia of $10\% \leqslant SiH_4/NH_3 \leqslant 20\%$, this deposition being continued until a nitride thickness of 3,000 to 5,000 A is obtained.

d. The deposition of the transfer layer 02 and the opening of the windows in the silicon nitride deposit NI, the underlying oxide layer 01 remains unattacked. This stage d) is shown in greater detail in FIG. 4. In fact, in (1) the nitride layer (cross-hatched) on the substrate Si"N" is covered in (2) by a transfer layer T, consisting either of pyrolytically produced $SiO_2$ or of polycrystalline Si; in (3) the photosensitive product PR of the type KMER or of the type KPR is applied and then engraved; in (4), the engraving of the transfer layer T is carried out, in the case of $SiO_2$ by means of the mixture $6—NH_4F+1—HF$, and in the case of Si, by means of the mixture $10—HNO_3$, $3—HF+6—CH_3COOH$; in (5), the engraving of the nitride is then carried out by using an acid such as $H_3PO_4$ at 180°C.; in (6) the transfer layer T is removed. The oxide 01 remains unattacked during the opening operations.

At this stage, the operation d) is complete, and the following are then carried out:

e. The pre-diffusion of P gallium through the underlying oxide layer 01 into the windows of the nitride masks; this pre-diffusion can be carried out, for example, in a sealed tube under argon at a temperature of 1,225°C. for a period of about 40 minutes, with the surface gallium concentration then reaching a value of $10^{19}$ at/cm$^3$ and the depth of the junction under these conditions being between 6 and 7 microns.

f. The removal of the underlying oxide layer 01 and of the silicon nitride mask N1 charged with gallium by acid attack with 49% HF.

g. New deposits of pyrolytic oxides O'1 are then produced as in b), followed by silicon nitride N'1 as in c), with these deposits having the same characteristics as those defined previously.

At this stage, the treated substrate is ready for the operation of deep penetration diffusion of gallium which is shown in h). This operation can take place either in a sealed tube under argon, like the pre-diffusion e), or in an open tube with an argon sweep (1 l/min). At 1,200°C., for example, and after a period of 65 hours, the depth of diffusion of the gallium reaches a value of 50 microns and the surface concentration of the impurity decreases by a factor of 10 as compared to the concentration found after the pre-diffusion treatment e).

The diffusion profile shown in FIG. 5 is thus obtained.

It now remains only to carry out the operation i) which consists in removing the layers of silicon nitride N'1 and of oxide O'1, with this operation being carried out by acid attack with 49% HF over a period of about 24 hours.

It should be noted that the removal of these layers, as in operation f), can be carried out by lapping. However, most lapping processes have the disadvantage that they are difficult to control and, because of this, the lapping may reach the first microns of the diffused layer and cause a decrease in the surface concentration of the gallium. Furthermore, it should be noted that, if one does not wish to remove the silicon nitride layer, the deposition of oxide carried out in operation for g) is not necessary.

The present invention is not limited to the examples of embodiments that have just been described; on the contrary, it is capable of variations and modifications which would appear to persons skilled in the art.

What is claimed is:

1. In a process of localized and deep diffusion of gallium into silicon, wherein the following sequential operations are carried out:

a. preparation of the surface of a sample of N-type silicon intended to receive a diffusion localization mask;
b. deposition of a first oxide layer on said surface;
c. deposition of a silicon nitride layer forming a mask on the first oxide layer;
d. photoengraving of the mask by means of photosensitive product and a transfer layer formed by a second oxide layer; and opening of localized diffusion windows in the mask;
e. pre-diffusion of gallium into the silicon through said windows and through said first oxide layer and
f. removal of the silicon nitride mask and of the first oxide layer, the improvement comprising then
g. depositing a new first oxide layer on the whole silicon surface, followed by depositing a new layer of silicon nitride on this oxide layer;
h. thermally treating said sample to cause penetration diffusion of gallium into the silicon and
i. removing the layers of oxide and silicon nitride deposited during operation g), in order to obtain a structure with localized and deep P-N junctions.

2. The process according to claim 1, characterized in that the deposition of the first oxide layer is carried out pyrolytically in a resistance furnace, using $SiH_4 + CO_2$ containing 1% $SiH_4$ at 775°C. with a flow rate of 8 liters per minute of $H_2$ until an oxide deposit with a thickness of about 2500 A is obtained, corresponding to a treatment time of about 15 minutes.

3. Process as in claim 1, characterized in that the deposition of the first oxide layer is carried out thermally in a diffusion furnace, using moist $O_2$ for two and a half hours, followed by dry $O_2$ for two hours, at a temperature of about 1,220°C., to obtain an oxide thickness of about 1 micron.

4. Process as in claim 1, characterized in that the deposition of the silicon nitride mask is carried out by the vapor phase chemical decomposition reaction of silane and ammonia, according to the following reaction: $3\ SiH_4 + 4\ NH_3\ (+H_2) \rightarrow Si_3N_4 + 12\ H_2\ (+H_2)$.

5. Process according to claim 1 characterized in that the process of deposition of the nitride mask consists of:

a. introducing the substrate to be treated into the interior of a reactor under a continuous sweep of nitrogen or of hydrogenated nitrogen, then, b. after closure of the reactor and heating of the reactor under a sweeping atmosphere, proceeding with the admission of the mixture of the reagents into the laboratory tube, these reagents used being of very high purity and comprising anhydrous ammonia, hydrogen used as carrier gas, pure silane or silane diluted in nitrogen, hydrogenated nitrogen used as sweep gas, argon used as purge gas for the silane circuit;

c. then carrying out the deposition of the nitride proper and, at the end of this deposition;

d. isolating the substrate enclosure from the stand for mixing and metering of the gaseous reagent, and lowering the temperature under a sweep of nitrogen or of hydrogenated nitrogen;

e. finally, removing the substrate coated with a nitride deposit from the reactor.

6. Process as in claim 1 characterized in that, in the preparation of the nitride mask using a reactor with resistance heating, the deposition temperature is between 800° and 850°C., the hydrogen carrier gas used is supplied at about 8 lit./min. and the silane/ammonia mixture contains between 10 and 20% silane, the rate of formation of the nitride at 850°C. with a silane/ammonia ratio of 2/10 being about 1,300 A per minute.

7. Process as in claim 1 characterized in that the silicon nitride film obtained has an infrared absorption spectrum in which only the absorption band due to the Si-N groups appears at 870 $cm^{-1}$.

8. Process according to claim 1, characterized in that the operation of photoengraving opening windows in the silicon nitride mask consists in depositing on this film a photoengravable adhesive compound which is selected to resist the action of acids capable of dissolving the nitride, so that it will constitute a mask for the opening of the nitride per se.

9. Process according to claim 1 characterized in that, for the photoengraving of the silicon nitride mask, there is used a transfer layer, with a thickness close to one micron, consisting of pyrolytic silica or polycrystalline silicon produced in situ in the reactor, and a photosensitive product.

10. Process according to claim 9, characterized in that the transfer layer in the form of a silica deposit is obtained by the action of carbon dioxide on silane in the presence of hydrogen carrier gas at a deposition temperature of 775° to 800°C., a hydrogen flow rate of 8 liters per minute, the silane/carbon dioxide mixture having 1–2% silane, the deposition rate being 180 A/min., the rate of dissolution the nitride in the mixture of 6-$NH_4F$ + 1-HF at 25°C. being 1.3 $\mu$/min.

11. Process according to claim 9, characterized in that the transfer layer in the form of a silicon deposit is obtained by the cracking of silane in the presence of hydrogen, the deposition temperature being 775°C., the hydrogen flow rate being 8 liters per minute, the silane/hydrogen mixture containing 0.2 to 0.5% silane, the rate of deposition being 1 micron per minute, the rate of solution of nitride in the mixture of 10-$HNO_3$, 3-HF and 6-$CH_3COOH$, at 25°C. being 2 $\mu$/min.

12. Process according to claim 1 characterized in that, for the pre-diffusion of gallium through the first oxide layer into the windows of the silicon nitride mask, silicon slices are placed vertically in a quartz tube with a source of 10 milligrams of gallium alloyed to silicon; and the tube is sealed under a pressure of 200 grams/$cm^2$ of argon after being under a high vacuum, and is then placed in a controlled furnace at 1,225°C. for a period of 14 minutes, with the decrease in temperature at the end of the diffusion cycle being 150°C. per hour.

13. Process according to claim 1 characterized in that the removal of the first oxide layer and of the nitride charged with gallium, after pre-diffusion operation, is carried out by attack with 49% concentrated HF at 25°C. for a period of about 24 hours.

14. Process according to claim 13 characterized in that the underlying layer of oxide (first oxide layer) allows the removal of the nitride mask after Gallium prediffusion and Gallium drive in operation in concentrated H.F.

15. Process according to claim 13 characterized in that a second deposition of pyrolytic oxide and then of silicon nitride on a substrate that has undergone removal of its layers of nitride and of pyrolytic oxide is carried out so as to give layers of oxide and silicon nitride having the same characteristics as the corresponding initial layers.

16. Process according to claim 1 characterized in that the thermal treatment for penetration diffusion of gallium into the silicon takes place either in a sealed tube under argon, or in an open tube under an argon sweep.

17. Process according to claim 1 characterized in that the new layer of silicon nitride is deposited with a thickness of 3,000 to 5,000 A.

* * * * *